United States Patent
Lee

(10) Patent No.: US 8,681,497 B2
(45) Date of Patent: Mar. 25, 2014

(54) BOARD COOLANT JACKET JIG SYSTEM AND METHOD OF SEPARATING BOARD COOLANT JACKET

(75) Inventor: Mu Yer Lee, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 244 days.

(21) Appl. No.: 13/241,761

(22) Filed: Sep. 23, 2011

(65) Prior Publication Data
US 2012/0138264 A1 Jun. 7, 2012

(30) Foreign Application Priority Data
Dec. 3, 2010 (KR) .................. 10-2010-0122843

(51) Int. Cl.
*H05K 7/20* (2006.01)
(52) U.S. Cl.
USPC .......... 361/699; 361/702; 361/707; 165/80.4; 174/15.1; 257/714; 257/718
(58) Field of Classification Search
None
See application file for complete search history.

(56) References Cited

U.S. PATENT DOCUMENTS

| | | | |
|---|---|---|---|
| 6,157,538 A * | 12/2000 | Ali et al. | 361/704 |
| 6,278,610 B1 * | 8/2001 | Yasufuku et al. | 361/704 |
| 6,366,463 B2 * | 4/2002 | Hamano | 361/704 |
| 6,483,708 B2 * | 11/2002 | Ali et al. | 361/719 |
| 6,621,707 B2 * | 9/2003 | Ishimine et al. | 361/721 |
| 6,746,790 B2 * | 6/2004 | Colborn | 429/434 |
| 6,873,530 B2 * | 3/2005 | Belady et al. | 361/719 |
| 7,177,156 B2 * | 2/2007 | Yatskov et al. | 361/709 |
| 7,187,552 B1 * | 3/2007 | Stewart et al. | 361/704 |
| 7,336,485 B2 * | 2/2008 | Leech et al. | 361/679.48 |
| 7,414,844 B2 * | 8/2008 | Wilson et al. | 361/699 |
| 7,427,210 B2 * | 9/2008 | Martinson et al. | 439/487 |
| 7,551,439 B2 * | 6/2009 | Peugh et al. | 361/699 |
| 8,018,719 B2 * | 9/2011 | Busch | 361/700 |
| 8,102,652 B2 * | 1/2012 | Toh et al. | 361/699 |

FOREIGN PATENT DOCUMENTS

| | | |
|---|---|---|
| JP | 08-062286 | 3/1996 |
| JP | 08-082653 | 3/1996 |
| JP | 2009-186351 | 8/2009 |

* cited by examiner

*Primary Examiner* — Boris Chervinsky
(74) *Attorney, Agent, or Firm* — Stanzione & Kim, LLP

(57) ABSTRACT

A board coolant jacket jig system includes a main frame that includes a board installation stand on which a board is installed, and a coolant jacket separation unit that is coupled to the main frame and selectively coupled to the coolant jacket coupled to the board, to separate the coolant jacket.

19 Claims, 9 Drawing Sheets

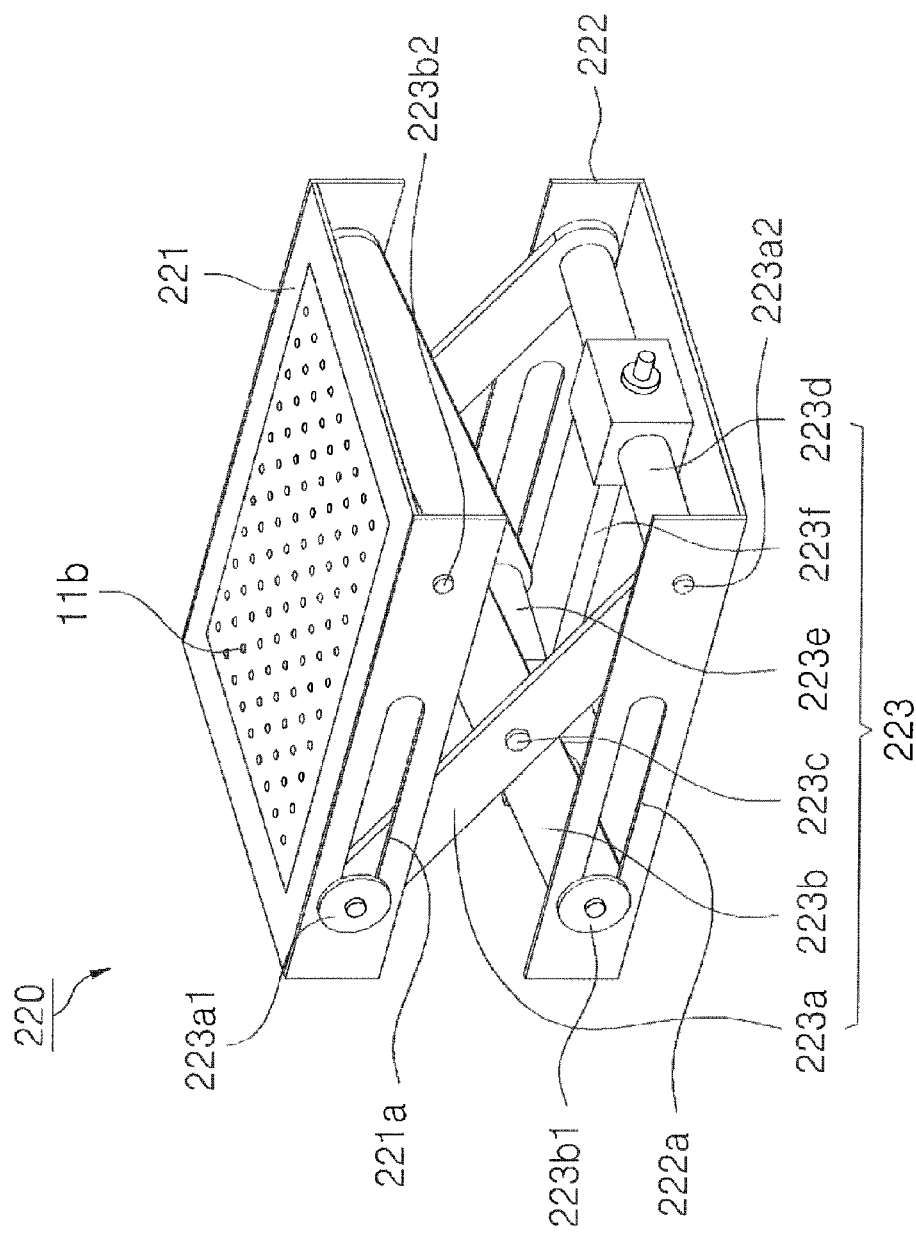

BOARD COOLANT JACKET JIG SYSTEM AND METHOD OF SEPARATING BOARD COOLANT JACKET

CROSS-REFERENCE TO RELATED APPLICATIONS

This application claims priority under 35 U.S.C. §119 from Korean Patent Application No. 10-2010-0122843, filed on Dec. 3, 2010, in the Korean Intellectual Property Office, the disclosure of which is incorporated herein in its entirety by reference.

BACKGROUND

1. Field of the General Inventive Concept

The general inventive concept relates to a board coolant jacket jig system and a method of separating a board coolant jacket, and more particularly, to a board coolant jacket jig system that may efficiently separate a coolant jacket of a board, and a method of separating a board coolant jacket.

2. Description of the Related Art

In general, of devices forming an electric circuit, a heat generating device, such as an IC device, that generates heat according to an operation, exists. In particular, as high operation speed or high density of an integrated circuit is developed, the amount of heat generated in an IC device increases so that an efficient cooling of the IC device is highly requested.

For example, in a device to mount a large scale integrated circuit (LSI) that is modularized to be mounted on one side or both sides of a printed board, an LSI device on a board that generates heat according to an operation needs to be cooled. Accordingly, a board cooling apparatus to cool a plurality of heat generating devices by covering the heat generating devices mounted on a board with a sealing case and making coolant flow along a predetermined path in the sealing case has been developed.

In a board on which the above-described board cooling apparatus is provided, when a defect is generated in a part on the board, the part may be replaced after separating the board cooling apparatus. However, since an apparatus used for the separation of a board cooling apparatus has not yet been developed yet, the separation is manually performed which is inefficient in maintenance and repair of a board.

SUMMARY

The inventive concept provides a board coolant jacket jig system that may efficiently and easily separate a coolant jacket of a board, and a method of separating a board coolant jacket.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a board coolant jacket jig system including a main frame that includes a board installation stand on which a board is installed, and a coolant jacket separation unit that is coupled to the main frame and selectively coupled to the coolant jacket coupled to the board, to separate the coolant jacket.

The coolant jacket separation unit may include an upper cover portion that is relatively rotatably coupled to the main frame to be capable of being selectively coupled to and disassembled from the coolant jacket arranged on an upper side of the board installed on the board installation stand.

The upper cover portion may include an upper panel that is relatively rotatably coupled to the main frame and includes a plate facing portion formed by penetrating the upper panel so that the coolant jacket of the board is accessed from the outside when the board is installed on the board installation stand, a panel plate coupling member that couples the coolant jacket and the upper panel, and a panel link that is rotatably coupled to each of the upper panel and the main frame and connects the panel and the main frame to control a rotation operation of the upper panel.

The coolant jacket separation unit may further include a plate elevation unit that is coupled to the main frame to ascend or descend the coolant jacket arranged on a lower side of the board installed on the board installation stand.

The coolant jacket elevation unit may includes a plate support portion that supports the coolant jacket from under the board, an elevation unit main body portion that is coupled to the main frame to support the plate support portion, and an elevation support portion that connects the plate support portion and the elevation unit main body portion to allow the plate support portion to move close to or away from the elevation unit main body portion.

The elevation support portion may include a pair of first support members, each having one end portion movably coupled to the plate support portion and the other end portion rotatably coupled to the elevation unit main body portion, a pair of second support members, each having one end portion rotatably coupled to the plate support portion and the other end portion movably coupled to the elevation unit main body portion, and a pair of coupling members that couple the first support members and the second support members to rotate the first support members and the second support members by being engaged with each other.

The elevation support portion may include a fixed member that is fixedly coupled to the elevation unit main body portion, a movable member that is coupled to the elevation unit main body portion to be capable of moving close to or away from the fixed member and coupled to the other end portion of each of the second support members that is coupled to the elevation unit main body portion, and a connection rod that connects the fixed member and the movable member to adjust an interval therebetween.

The main frame may include a first support portion that has the board installation stand and supports the board, and a second support portion that supports the plate elevation unit.

The main frame may further include a rotation bracket that is provided on a lower surface of the main frame to be capable of relatively rotating with respect to the main frame, and a wheel that is rotatably coupled to the rotation bracket.

The board installation stand may include a pair of board guides that is provided at the main frame to guide the board from the opposite lateral sides of the board to be slidably installed, and a board stopper that is provided at an end portion of each of the board guides to prevent escape of the board.

The board coolant jacket jig system may further include a coolant pump that is connected to the coolant jacket and exhausts coolant from an inside of the coolant jacket or supplies the coolant to the inside of the coolant jacket, and a coolant storage tank that is connected to the coolant pump and stores the coolant exhausted from the coolant jacket.

The board coolant jacket jig system may further include a coolant pressure gauge that is connected between the coolant jacket and the coolant pump and measures pressure of the coolant when the coolant of the coolant jacket is exhausted or supplied by the coolant pump.

The board coolant jacket jig system may further include an air supply portion that is connected to a coolant input hose connected to the coolant jacket and supplies air, and a switch that turns on or off air supply from the air supply portion to the coolant input hose.

The foregoing and/or other aspects and utilities of the present general inventive concept may also be achieved by installing a board, to which a coolant jacket is coupled, on a board installation stand of a main frame, exhausting coolant of an inside of the coolant jacket, covering the board with an upper panel of an upper cover portion, coupling the coolant jacket and the upper panel, disassembling the coolant jacket and the board, performing an opening operation by relatively rotating the upper panel, and taking outside the board from which the coolant jacket is separated.

The coolant jacket may be coupled to each of upper and lower sides of the board, and the method may further include supporting the coolant jacket arranged on the lower side of the board by raising a plate support portion of a plate elevation unit, before the coolant jacket and the board are disassembled from each other, and performing an opening operation by lowering the plate support portion and relatively rotating the upper panel, after the coolant jacket and the board are disassembled from each other.

In the disassembling of the coolant jacket and the board from each other, the coolant jacket and a coupling member of the board may be disassembled from each other through a plate facing portion formed by penetrating the upper panel.

The foregoing and/or other aspects and utilities of the present general inventive concept may also be achieved by providing a coolant jacket system to cool a printed circuit board, including a main frame including a first support portion and a second support portion, a printed circuit board mounted on the first support portion, a coolant jacket including an upper coolant jacket and a lower coolant jacket to surround the printed circuit board, and a coolant jacket separation unit mounted on both of the first support portion and the second support portion respectively, including an upper cover portion including a plurality of panel plate coupling members to couple the upper coolant jacket to the upper cover portion, and a plate elevation unit to couple the lower coolant jacket to the printed circuit board to cool the printed circuit board.

The panel plate coupling members may be disposed at peripheral edges of the upper cover portion.

The plate elevation unit may include a plurality of slots in order to adjust the height of the plate elevation unit.

The upper cover portion may be coupled to the plate elevation unit such that when the upper cover is opened the plate elevation unit is lowered.

DESCRIPTION OF THE DRAWINGS

These and/or other features and utilities of the present general inventive concept will become apparent and more readily appreciated from the following description of the embodiments, taken in conjunction with the accompanying drawings of which:

FIG. 9 is an enlarged perspective view illustrating a plate elevation unit.

DETAILED DESCRIPTION OF THE PREFERRED EMBODIMENTS

Figure 1:
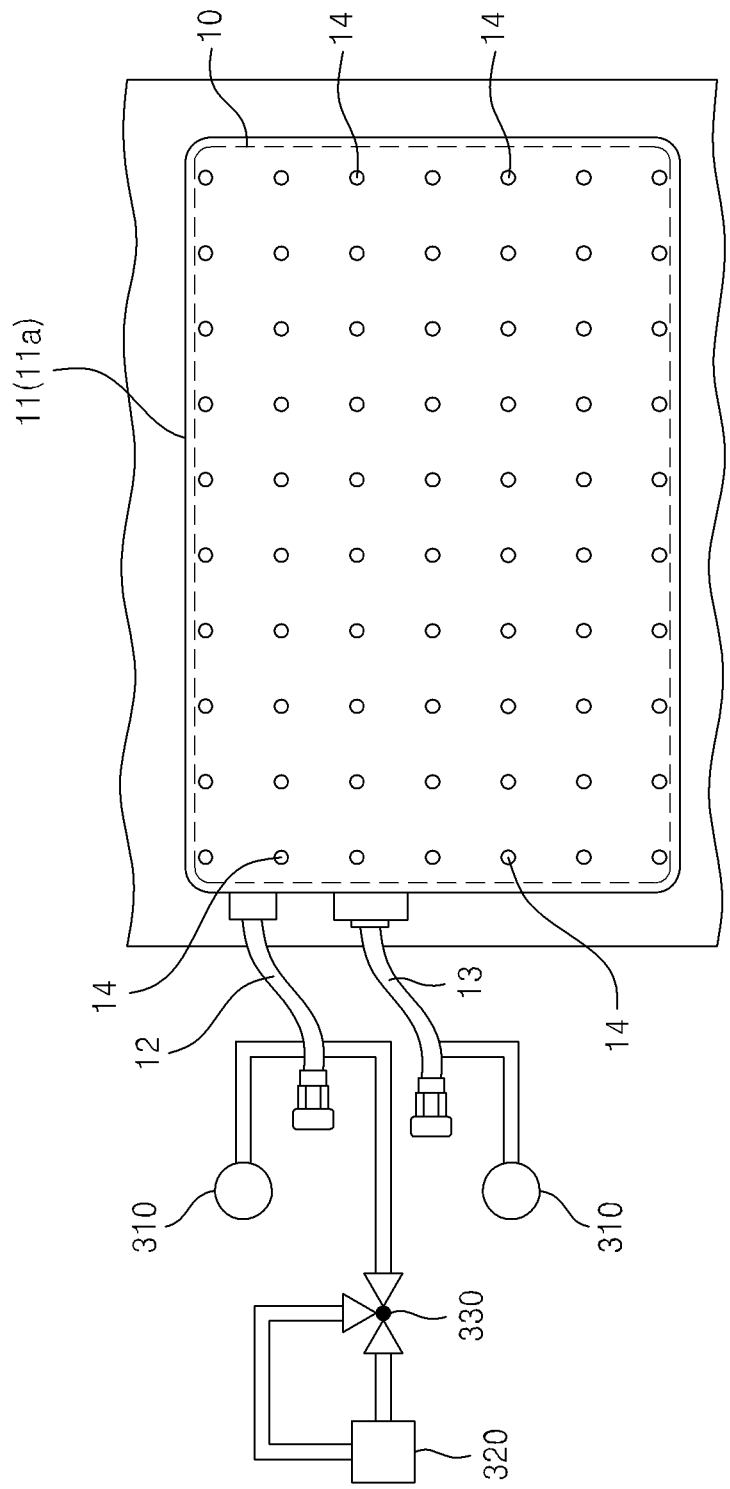
FIG. 1 is a plan view illustrating a board to which a coolant jacket according to an exemplary embodiment of the present general inventive concept is coupled.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Figure 2:
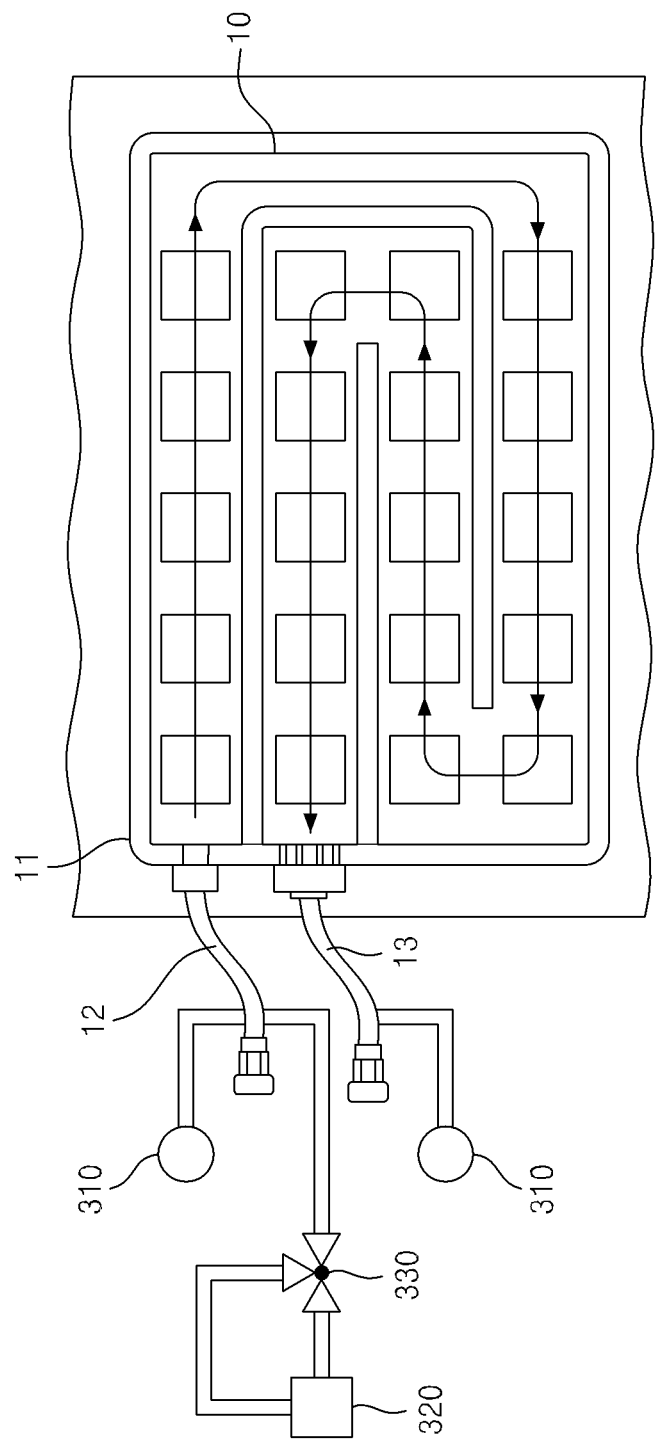
FIG. 2 is a plan view illustrating the flow of coolant inside the coolant jacket of FIG. 1.

FIG. 1 is a plan view illustrating a board to which a coolant jacket according to an exemplary embodiment of the present general inventive concept is coupled. FIG. 2 is a plan view illustrating the flow of coolant inside the coolant jacket of FIG. 1.

A board coolant jacket jig system according to an exemplary embodiment of the present general inventive concept, as illustrated in FIGS. 1 and 2, is used to separate a coolant jacket 11 from a board 10. Prior to a description of the board coolant jacket jig system according to the present exemplary embodiment, the board 10 and the coolant jacket 11 employed in the present exemplary embodiment are briefly described with reference to FIGS. 1 and 2.

As illustrated in FIGS. 1 and 2, the board 10 and the coolant jacket 11 are coupled to each other using a plurality of coupling members (not illustrated), for example, a bolt coupled to a bolt insertion hole 14 in the present exemplary embodiment. As coolant flows inside the coolant jacket 11 of the board 10, heat generating devices of integrated circuitry 16 mounted on one or both sides of the board 10 are cooled. The heat generating devices may have been newly mounted on one or both sides of the board 10. Also, the coolant jacket 11 may be used when integrated circuitry on either or both sides of the board are in the process of, or have just been programmed or accessed. The coolant may be injected into the coolant jacket 11 through a coolant input hose 12 and exhausted to the outside of the coolant jacket 11 through a coolant output hose 13. Portions where the coolant jacket 11 and the board 10 are coupled in contact with each other are sealed so that the coolant is prevented from leaking to the outside.

As illustrated in FIG. 2, the coolant input hose 12 and the coolant output hose 13 are positioned on a same side of the board 10. However, the coolant input hose 12 and coolant output hose may be positioned on any side of the board 10. Also, the coolant input hose 12 and coolant output hose 13 may be positioned apart from each other, on opposite or adjacent sides of the board 10. The varying positions of the hoses may be implemented to take advantage of various configurations of the different elements of the coolant jacket jig system 1 (illustrated in FIG. 3). The flow of the coolant illustrated by the arrows of FIG. 2 is not limited to the diagram provided, but may rather flow in multiple different paths in accordance with the placement of the coolant input hose 12 and the coolant output hose 13.

The coolant jacket 11 may be provided only on one side of the board 10 or on both sides of the board 10. In the present exemplary embodiment, the coolant jacket 11, including an upper coolant jacket 11a and a lower coolant jacket 11b (illustrated in FIG. 9), is provided on both sides of the board 10. The coolant jacket 11 may be formed to surround the external edges of the board 10 to that the coolant jacket 11 may be fastened around the board, but does not pass through any portions of the board 10. The dotted lines in FIGS. 1 represent the board 10 that is positioned underneath the upper coolant jacket 11a. The board coolant jacket jig system 1 (illustrated in FIG. 3) according to the present exemplary embodiment is used to separate the coolant jacket 11 from both sides of the board 10. The board coolant jacket jig system 1 (illustrated in FIG. 3) according to the present exemplary embodiment is described below.

Figure 3:
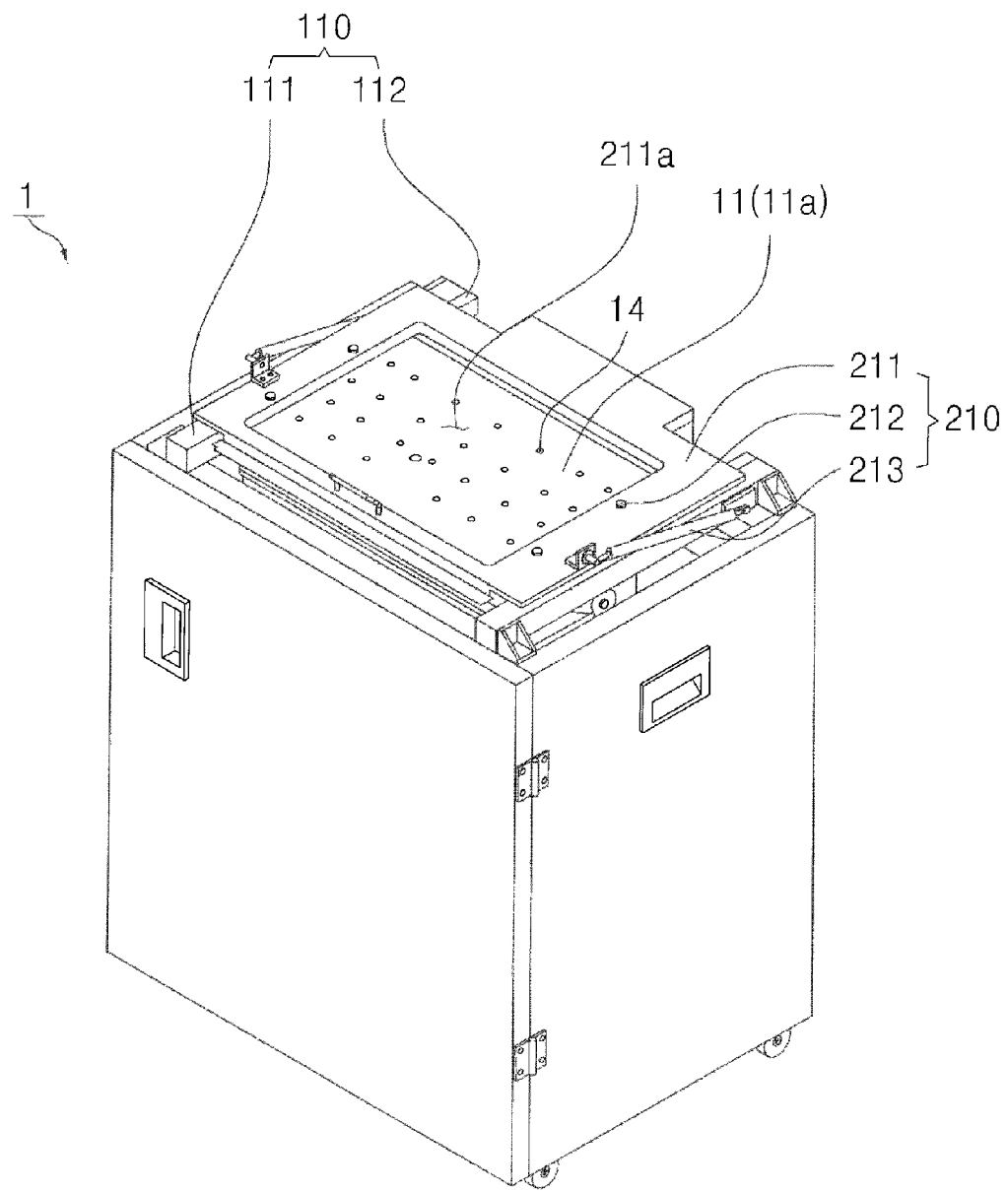
FIG. 3 is a perspective view illustrating a board coolant jacket jig system according to an exemplary embodiment of the present general inventive concept.
Figure 4:
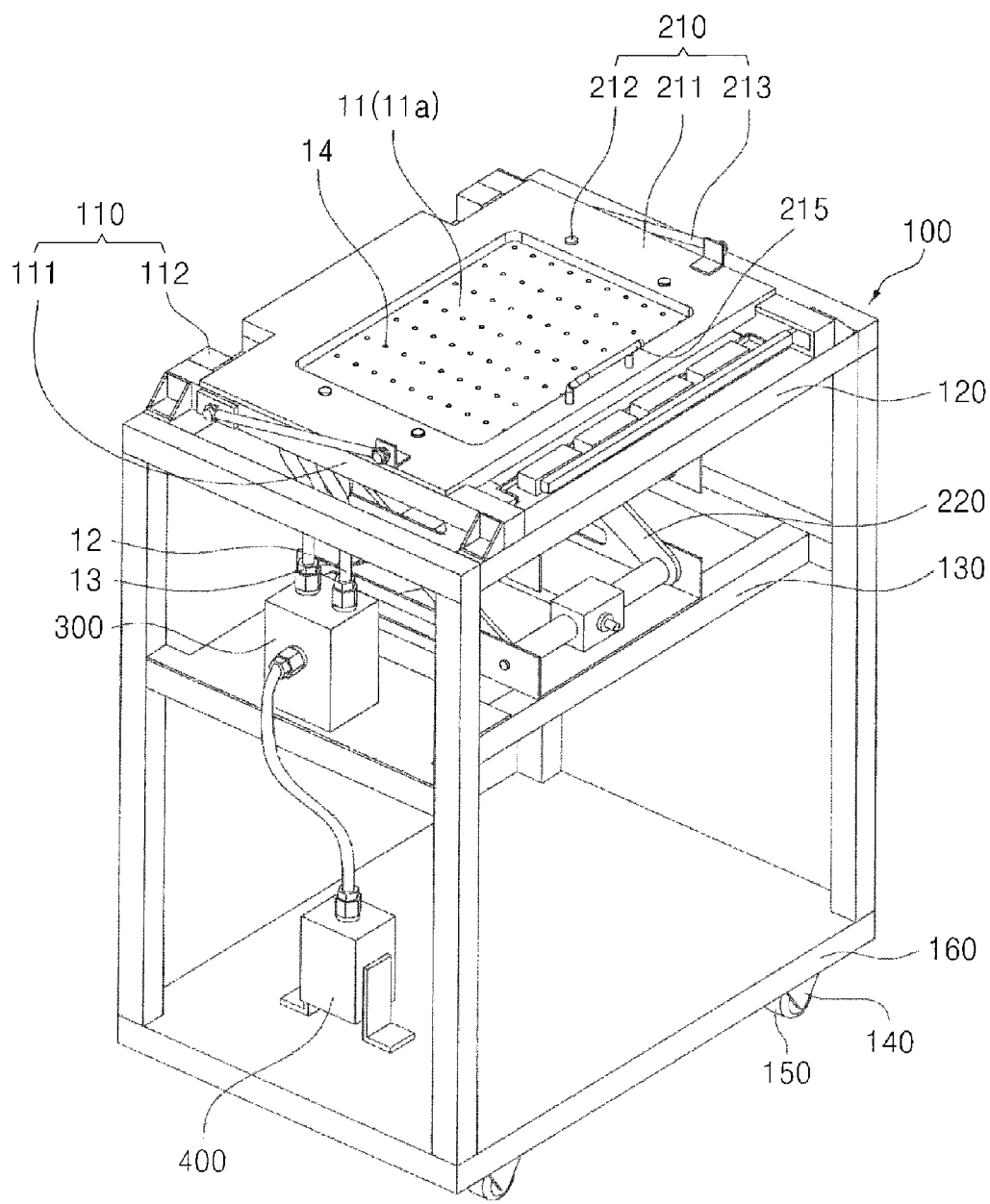
FIG. 4 is a perspective view illustrating the inside of the board coolant jacket jig system of FIG. 3.
Figure 5:
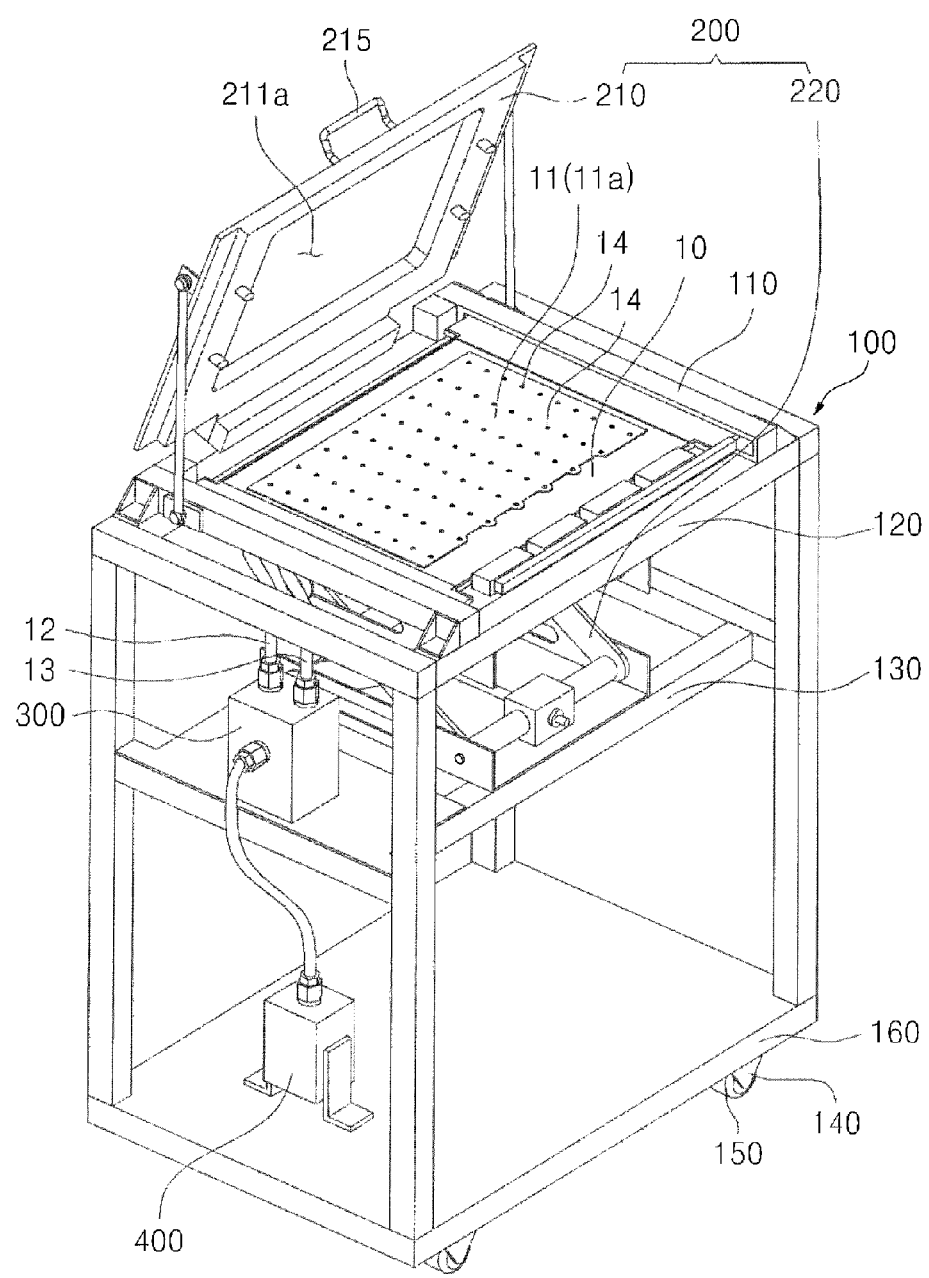
FIG. 5 is a perspective view illustrating when an upper panel of FIG. 4 is open.
Figure 6:
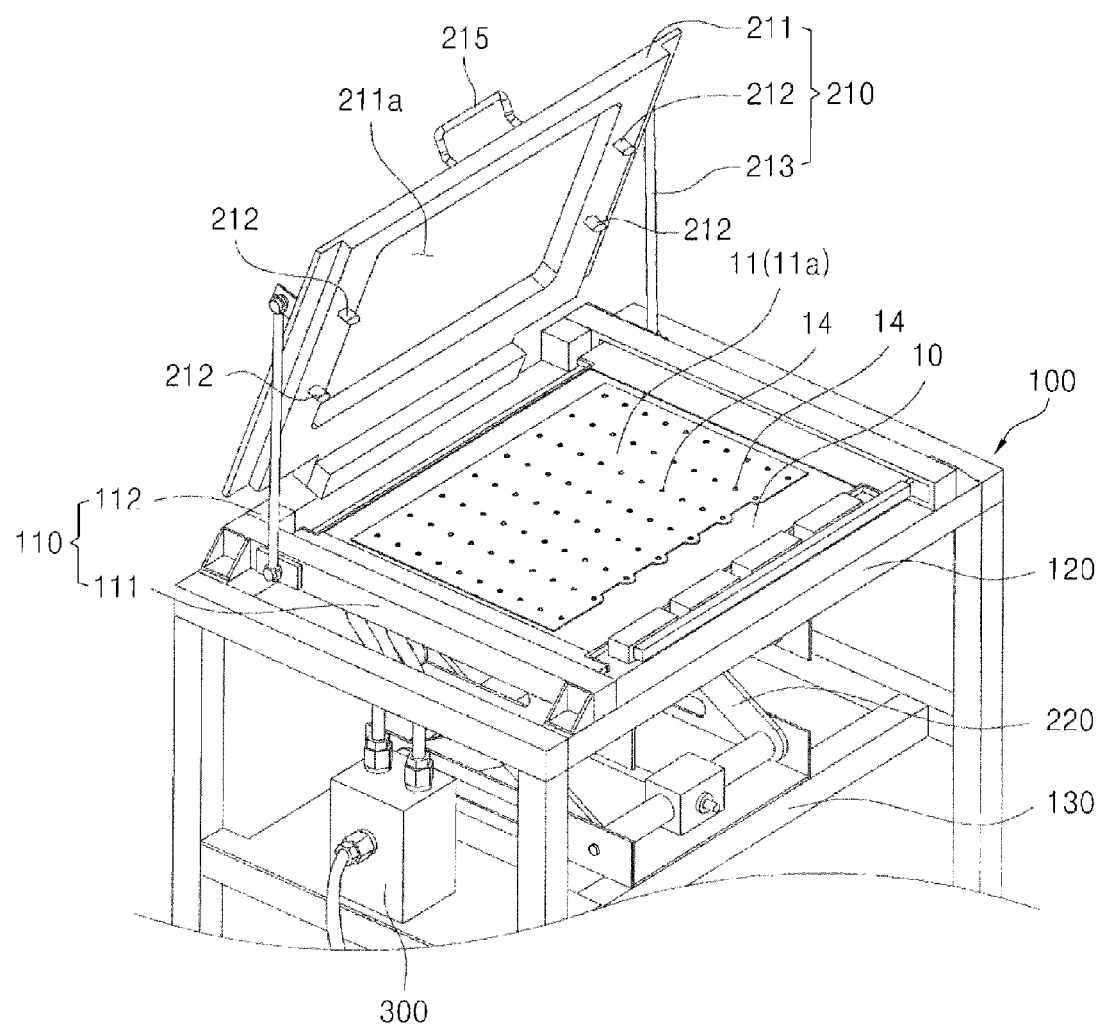
FIG. 6 is an enlarged perspective view illustrating major portions of FIG. 5.
Figure 7:
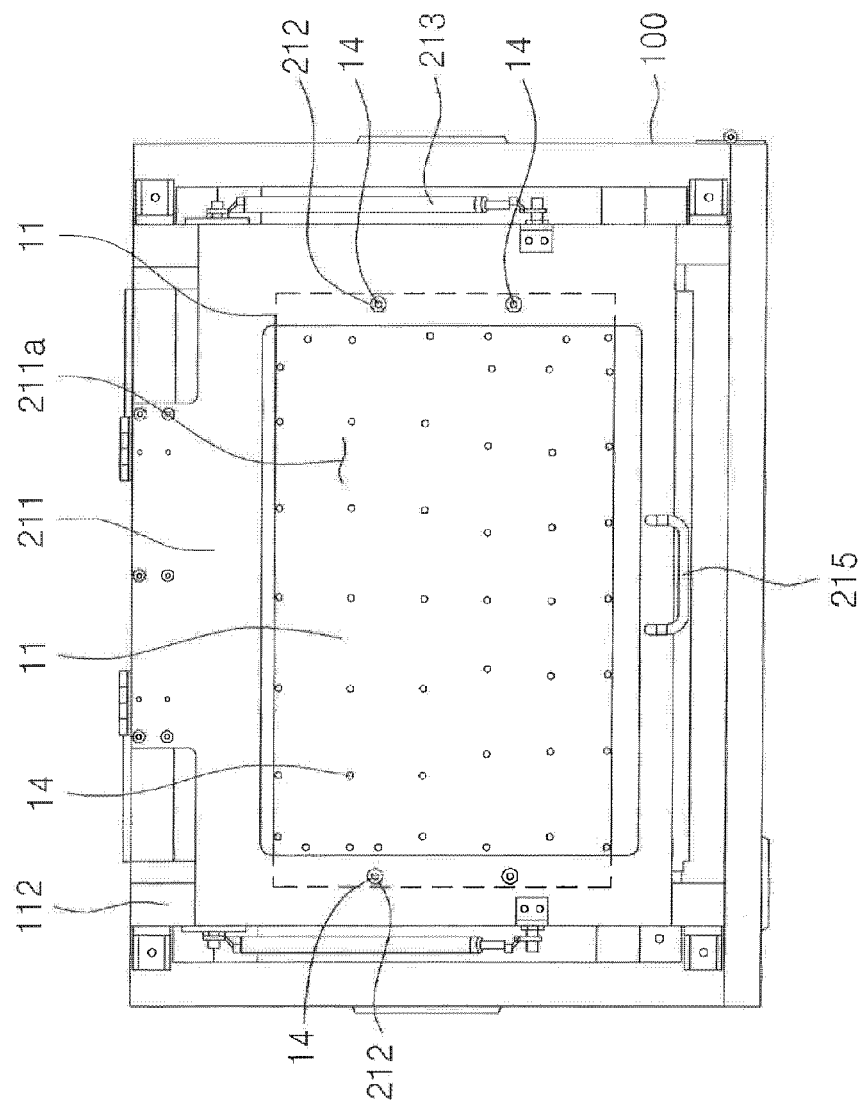
FIG. 7 is a plan view illustrating the board coolant jacket jig system of FIG. 3.
Figure 8:
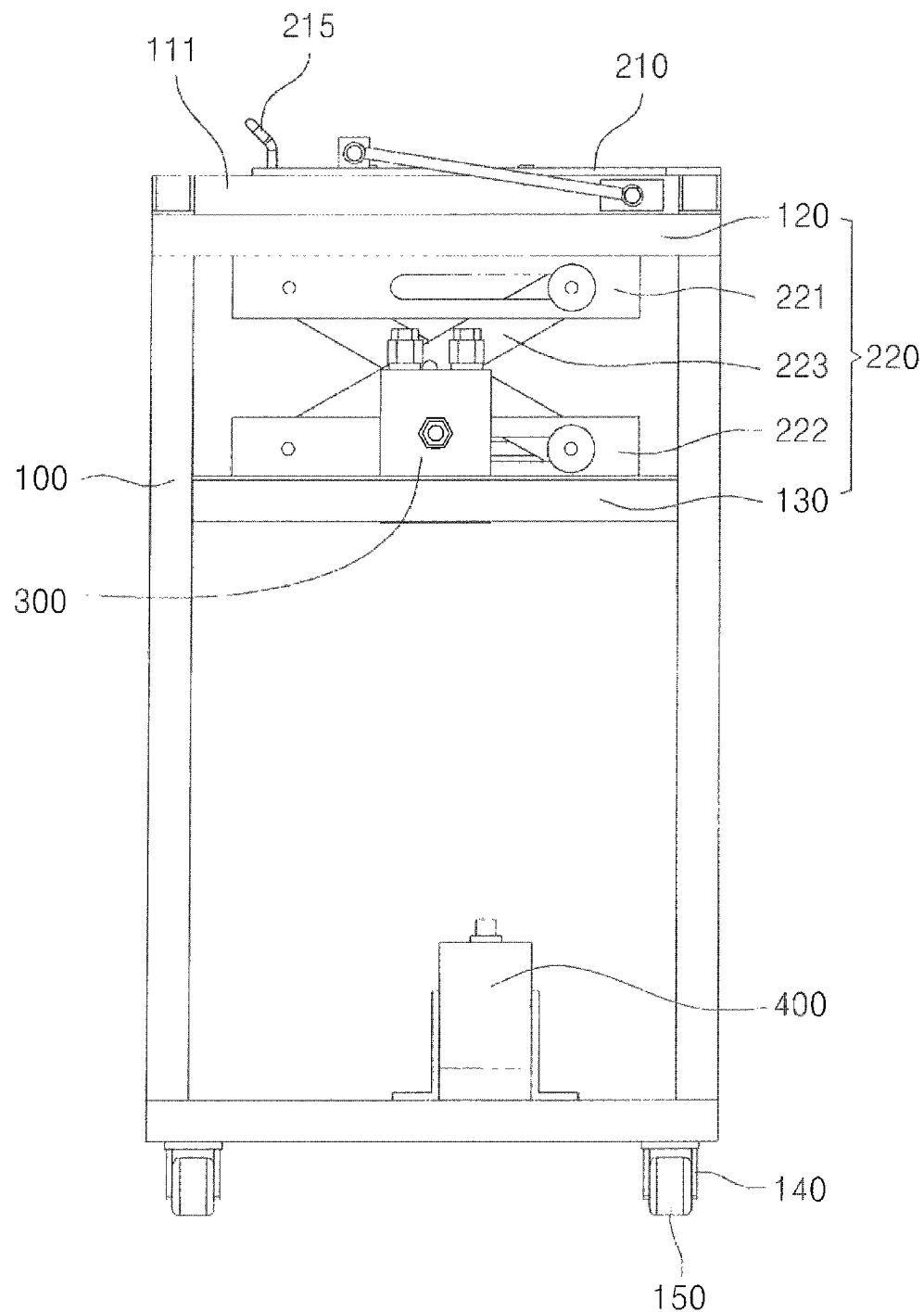
FIG. 8 is a side view illustrating the board coolant jacket jig system of FIG. 4.

FIG. 3 is a perspective view illustrating a board coolant jacket jig system 1 according to an exemplary embodiment of the present general inventive concept. FIG. 4 is a perspective view illustrating the inside of the board coolant jacket jig system of FIG. 3. FIG. 5 is a perspective view illustrating when an upper panel of FIG. 4 is open. FIG. 6 is an enlarged perspective view illustrating major portions of FIG. 5, FIG. 7 is a plan view illustrating the board coolant jacket jig system of FIG. 3, FIG. 8 is a side view illustrating board coolant jacket jig system of FIG. 4, FIG. 9 is an enlarged perspective view illustrating a plate elevation unit.

Referring to FIGS. 1-8, the board coolant jacket jig system 1 according to the present exemplary embodiment includes a main frame 100 having a board installation stand 110 on which the board 10 is installed, a coolant jacket separation unit 200 coupled to the main frame 100, in particular, selectively coupled to the coolant jacket 11 that is coupled to the board 10, to separate the coolant jacket 11. The system 1 also includes a coolant pump 300 connected to the coolant jacket 11 and exhausting coolant from the coolant jacket 11 or supplying the coolant to the inside of the coolant jacket 11, and a coolant storage tank 400 connected to the coolant pump 300 and storing the coolant exhausted from the coolant jacket 11.

The main frame 100 forms a frame of the board coolant jacket jig system, as illustrated in FIGS. 3 and 4, and supports the board 10, the coolant jacket separation unit 200, the coolant pump 300, and the coolant storage tank 400. The main frame 100 is easy to assemble and disassemble and may be formed of an aluminum (Al) profile that is light and exhibits superior strength and durability.

In the present exemplary embodiment, the main frame 100 may include a first support portion 120 having the board installation stand 110 disposed therein and supporting the board 10, a second support portion 130 supporting a plate elevation unit 220, and a third support portion 160 supporting the coolant storage tank 400. The numbers of and the interval between the first, second, and third support portions 120, 130, and 160 may be changed if necessary.

The board installation stand 110 is provided on the first support portion 120. The board installation stand 110 is a place where the board 10 is stably placed to separate the coolant jacket 11 from the board 10. In the present exemplary embodiment, the board installation stand 110 is provided to correspond to the size of the board 10 and has a sliding structure so as to facilitate installation of the board 10.

The board installation stand 110, as illustrated in FIGS. 5-8, includes a pair of board guides 111 provided at the first support portion 120 to guide the board from the opposite lateral sides of the board 10 to be slidably installed, and board stoppers 112 provided at an end portion of each of the board guides 111 in a direction in which the board 10 is installed, to prevent escape of the board 10. The board 10 may be configured in an "H" shape such that an upper and lower edge of the board 10 respectively abut the stoppers 112 to prevent escape of the board 10.

The board guides 111 are provided on an upper surface of the first support portion 120 in a size to correspond to that of the board 10, to guide the board 10 from the opposite lateral sides of the board 10. The board stopper 112 is provided at the end portion of the board guide 111 and prevents the board 10 from escaping from the board installation stand 110.

The board guides 111 may each have a slot disposed therein in order to slidably install the board 10. The respective slots may have the same depth, or one slot may be deeper than the other to facilitate mounting of the board 10 into the slots.

According to the above-described configuration, when the board 10 is installed on the board installation stand 110, the board 10 is slidably installed by the board guides 111 and is prevented from escaping to the outside by the board stopper 112. The board 10 may be aligned to an accurate installation position on the board installation stand 110 by the help of the board guides 111 and the board stopper 112.

The main frame 100 includes a rotation bracket 140 provided at a lower surface of the main frame 100 to be capable of relatively rotating with respect to the main frame 100 and a wheel 150 rotatably coupled to the rotation bracket 140. Due to the rotation bracket 140 and the wheel 150, the board coolant jacket jig system 1 can be easily moved to a place where a board coolant jacket separation operation is to be performed.

The coolant jacket separation unit 200, as illustrated in FIGS. 4-9, includes an upper cover portion 210 relatively rotatably coupled to the main frame 100 so as to be selectively coupled to or disassembled from the upper coolant jacket 11a that is arranged on an upper side of the board 10 installed on the board installation stand 110. The coolant jacket separation unit 200 also includes a plate elevation unit 220 coupled to the main frame 100 to raise or lower a coolant jacket 11b (illustrated in FIG. 9) arranged on a lower side of the board 10 installed on the board installation stand 110.

The upper cover portion 210, as illustrated in FIGS. 5 and 6, includes an upper panel 211 rotatably coupled to the main frame 100 and having a plate facing portion 211a provided by passing through the upper panel 211 such that the coolant jacket 11 of the board 10 can be accessed from the outside even when the upper panel 211 is closed with the board 10 being installed on the board support stand 100, a panel plate coupling member 212 coupling the coolant jacket 11 and the upper panel 211, and a panel link 213 rotatably coupled to each of the upper panel 211 and the main frame 100 to connect the upper panel 211 and the main frame 40 100 and controlling the rotation of the upper panel 211.

The upper panel 211 is rotatably coupled to the first support portion 120 of the main frame 100 to cover the board installation stand 110. That is, when the upper panel 211 covers the board installation stand 110, the upper panel 211 is rotatably coupled to the main frame 100 such that the coolant jacket 11 of the board 10 installed on the board installation stand 110 can correspond to the plate facing portion 211a provided at the upper panel 211.

Also, the plate facing portion 211a is formed by penetrating or recessing a panel surface of the upper panel 211 such that the coolant jacket 11 of the board 10 can be exposed to the outside when the upper panel 211 covers the board 10 installed on the board installation stand 110. The size of the plate facing portion 211a is provided to correspond to the size of the coolant jacket 11 of the board 10. The plate facing portion 211a may be implemented as a removable panel to allow access to the upper coolant jacket 11a.

The panel plate coupling member 212 couples the coolant jacket 11 of the board 10 installed on the board installation stand 110 and the upper panel 211. In the present exemplary embodiment, a bolt that is coupled to the bolt insertion hole 14 formed in the coolant jacket 11 of the board 10 by passing through a through hole (not illustrated) formed in the panel surface of the upper panel 211 at a position to correspond to the bolt insertion hole 14 is used as the panel plate coupling member 212. However, the scope of the present general inventive concept is not limited thereto and the coupling of the coolant jacket 11 and the upper panel 211 may be formed in a variety of methods. Although in the present exemplary embodiment four panel plate coupling members 212 are provided to couple the upper panel 211 and the coolant jacket 11, the number and position thereof may be changed if necessary.

As illustrated in FIG. 7, for example, bolts used as the panel plate coupling members 212 in the present exemplary embodiment may be coupled to the bolt insertion holes 14 formed in the coolant jacket 11 by passing through the through hole of the upper panel 211. This is illustrated by the dotted lines 14 positioned within the bolts 212. The dotted lines within the panel plate coupling members 212 represent the insertion holes 14 positioned beneath the upper panel 211, through which the panel plate coupling members 212 are inserted. The panel plate coupling members 212 are configured to have a predetermined length so as to couple the coolant jacket 11a only, and not be coupled to the board 10. Accordingly, while only the upper panel 211 and the coolant jacket 11a are coupled to each other, the board 10 is not coupled to the upper panel 211. Also illustrated in FIG. 7 is that the water jacket 11 extends beyond the length of the plate facing portion 211a to be coupled by the panel plate coupling members 212 through the upper cover portion 210.

The panel link 213, which is rotatably coupled to each of the upper panel 211 and the main frame 100, connects the upper panel 211 and the main frame 100. In the present exemplary embodiment, the panel link 213 is provided in the form of a piston rod inserted in a hydraulic cylinder. As the piston rod is inserted in or ejected from the inside of the hydraulic cylinder, the rotation of the upper panel 211 is controlled. Accordingly, during the rotation of the upper panel 211, the upper panel 211 is prevented from drastically ascending or descending.

The plate elevation unit 220, as illustrated in FIGS. 4-6 and FIGS. 8 and 9, is installed on the second support portion 130 of the main frame 100 to ascend or descend, such as to raise or lower the coolant jacket 11b arranged on the lower side of the board 10 installed on the board installation stand 110.

The plate elevation unit 220 includes a plate support portion 221 supporting the coolant jacket 11b on the lower side of the board 10 from under the board 10. The plate elevation unit 220 also includes an elevation unit main body portion 222 installed at the main frame 100 and supporting the plate support portion 221, and an elevation support portion 223 interconnecting the plate support portion 221 and the elevation unit main body portion 222 to allow the plate support portion 221 to move close to or away from the elevation unit main body portion 222.

The plate support portion 221 supports the lower coolant jacket 11b that is coupled to the lower side of the board 10, from under the board 10. The elevation unit main body portion 222 is coupled to the second support portion 130 of the main frame 100 and supports the plate support portion 221.

The plate elevation unit 220 raises the lower coolant jacket 11b to be in contact with the board 10. Though not illustrated, additional hoses to input and output coolant from the coolant pump 300 may be connected to the lower coolant jacket 11b.

The elevation support portion 223 is arranged between the elevation unit main body portion 222 and the plate support portion 221 to connect the elevation unit main body portion 222 and the plate support portion 221, and adjusts the height of the plate support portion 221.

The elevation support portion 223, as illustrated in FIG. 9, includes a pair of first support members 223a, each having one end portion movably coupled to the plate support portion 221 and the other end portion rotatably coupled to the elevation unit main body portion 222, a pair of second support members 223b, each having one end portion rotatably coupled to the plate support portion 221 and the other end portion movably coupled to the elevation unit main body portion 222, a pair of coupling members 223c that couple the first support members 223a and the second support members 223b to rotate the first support members 223a and the second support members 223b by being engaged with each other, a fixed member 223d fixedly coupled to the elevation unit main body portion 222, a movable member 223e coupled to the elevation unit main body portion 222 to be capable of moving close to or away from the fixed member 223d to raise or lower the plate support portion 221. The movable member 223e is coupled to the lower end portions of each of the second support members 223b that is coupled to the elevation unit main body portion 222. A connection rod 223f connects the fixed member 223d and the movable member 223e to adjust an interval therebetween.

The first support member 223a and the second support member 223b are rotatably coupled to each other by the coupling members 223c. The first support member 223a and the second support member 223b are respectively connected to the lateral surfaces of the plate support portion 221 and the elevation unit main body portion 222. One end portion of the first support member 223a is connected to the plate support portion 221 via a slidable member 223a1 to be capable of relatively moving in a lateral direction and the other end thereof is connected to the elevation unit main body portion 222 to be capable of relatively rotating about a rotation portion 223a2. One end portion of the second support member 223b is connected to the plate support portion 221 via a rotation portion 223b2 to be capable of relatively rotating about the rotation portion 223b2 and the other end thereof is connected to the elevation unit main body portion 222 via a slidable member 223b1 to be capable of relatively moving in a lateral direction.

An end portion of the plate support portion 221 includes a slot 221a in which the slidable member 223a1 can slide towards the center of the plate support portion 221. Similarly, an end portion of the elevation unit main body portion 222 includes a slot 222a in which the slidable member 223b1 can slide towards the center of the elevation unit main body portion 222.

A rotation shaft (not illustrated) to which the first support members 223a are connected, to be capable of relatively rotating with respect to the elevation unit main body portion 222, is coupled to the fixed member 223d and positioned within the fixed member 223d. The fixed member 223d is coupled to the elevation unit main body portion 222.

The movable member 223e connects the second support members 223b. Accordingly, the second support members 223b movably connected to the elevation unit main body portion 222 may move identically to each other in order to keep the top surface of the plate support portion 221 at an even horizontal level to raise or lower the lower coolant jacket 11b.

This movement may also prevent the lower coolant jacket 11b from sliding off, or being incorrectly positioned on the bottom side of the board 10.

The connection rod 223f connects the fixed member 223d and the movable member 223e. In the present exemplary embodiment, the connection rod 223f is connected to the fixed member 223d by penetrating the fixed member 223d. The connection rod 223f has a threaded end portion. A rotation handle (not illustrated) is connected to the threaded end portion of the connection rod 223f. By rotating the rotation handle, the connection rod 223f adjusts the interval between the first support member 223a and the second support member 223b.

When the interval between the first support member 223a and the second support member 223b decreases by rotating the rotation handle and the slidable members 223a1 and slidable members 223b1 are positioned to be away from the center of the plate support portion 221 and elevation unit main body portion 222 respectively, the length of the connection rod 223f connecting the fixed member 223d and the movable member 223e decreases, and the height of the plate support portion 221 increases. When the interval between the first and second support members 223a and 223b increases, that is, the length of the connection rod 223f connecting the fixed member 223d and the movable member 223e increases, and the height of the plate support portion 221 decreases.

Also, the plate elevation unit 220 may be coupled to the upper cover portion 210 in a manner such that when a user lifts up on the handle 215 atop the upper cover portion 210 to separate the upper cover portion 210 from the upper coolant jacket 11a, the plate elevation unit 220 descends. This may be accomplished by the use of a coupling arm (not illustrated) connected between the plate support portion 221 and the panel link 213 of the upper cover portion 210. When a user pulls up on the handle 215, a coupling link (not illustrated) coupled to the coupling arm (not illustrated) slides down the panel link 213 to push the plate support portion 221 downward. Likewise, when the upper cover portion 210 is closed, such as by using the handle 215 or a manual closing of the upper cover portion 210, the coupling of the plate support portion 221 to the panel link 213 causes the plate support portion 221 to ascend. The coupling link (not illustrated) and coupling arm (not illustrated) may be disengaged when only an upper 11a or lower 11b cooling jacket is in use.

Referring to FIGS. 4 and 5, the coolant pump 300 is installed at the second support portion 130 of the main frame 100 and connected to the coolant input hose 12 and the coolant output hose 13 that are connected to the coolant jacket 11. The coolant pump 300 injects coolant into the coolant jacket 11 or exhausts the coolant from the coolant jacket 11.

The coolant storage tank 400 is supported on the third support portion 160 of the main frame 100 and connected to the coolant pump 300 to store the coolant exhausted from the coolant jacket 11.

The board coolant jacket jig system 1 according to the present exemplary embodiment further includes a coolant pressure gauge 310. The coolant pressure gauge 310 is connected between the coolant jacket 11 and the coolant pump 300 and measures pressure of the coolant when the coolant of the coolant jacket 11 is exhausted (illustrated in FIG. 1) or supplied (illustrated in FIG. 2) by the coolant pump 300. The coolant pressure gauge 310 determines whether the coolant leaks from the coolant pump 300, coolant storage tank 400 or one of the connecting hoses, by measuring the input or output pressure of the coolant.

The board coolant jacket jig system 1 according to the present exemplary embodiment may further include an air supply portion 320 connected to the coolant input hose 12 connected to the coolant jacket 11 to supply air, and a valve 330 to turn on or off of the air from the air supply portion 320 to the coolant input hose 12. Accordingly, when the valve 330 is turned to a first side to allow the air to be supplied from the air supply portion 320 to enter the coolant input hose 12, air is supplied to the coolant jacket 11 so that cleaning may be performed or remaining coolant may be completely removed. When the valve 330 is turned to a second side to stop the air flow from the air supply portion 320 to be input into the coolant input hose 12, the operation of the coolant pump 300 that is in an operation mode is automatically stopped.

The operation of the board coolant jacket jig system 1 configured as above is described below. The board 10 is installed on the board installation stand 110 of the main frame 100 and the coolant input hose 12 and the coolant output hose 13 of the coolant jacket 11 are connected to the coolant pump 300. Next, the coolant in the coolant jacket 11 is exhausted using the coolant pump 300 and stored in the coolant storage tank 400.

The upper panel 211 of the upper cover portion 210 is rotated with respect to the main frame 100 to cover the board 10. The plate support portion 221 of the plate elevation unit 220 is raised to contact and support the coolant jacket 11b provided on the lower side of the board 10.

Next, the coolant jacket 11a and the upper panel 211 are coupled to each other using the panel plate coupling member 212 of the upper cover portion 210.

The coupling members (not illustrated) coupling the coolant jacket 11a and the board 10, are disassembled through the plate facing portion 211a of the upper panel 211. In the present exemplary embodiment, a bolt is used as the coupling members (not illustrated) to couple the board 10 and the coolant jacket 11, that may include coolant jackets 11a and 11b. Since the bolt couples the board 10 and the coolant jacket 11 by penetrating the coolant jackets 11a and 11b installed at both sides of the board 10, when the bolt is disassembled, the board 10 and the coolant jackets 11 arranged on the upper and lower sides of the board 10 are all separated from each other.

In a state in which the board 10 and the coolant jacket 11 are separated from each other, the upper cover portion 210 is opened by lowering the plate support portion 221 of the plate elevation unit 220 and rotating the upper panel 211 of the upper cover portion 210. Since the coolant jackets 11a and 11b are all separated from both sides of the board 10, the coolant jacket 11a arranged on the upper side of the board 10 is separated with the upper panel 211 by rotating the upper panel 211 of the upper cover portion 210. The coolant jacket 11b arranged on the lower side of the board 10 is separated from the board 10 by lowering the plate support portion 221 of the plate elevation unit 220.

The board 10 from which the coolant jackets 11 are all separated may then be removed from the board installation stand 110 for further processing.

The coolant jacket 11 may be efficiently and easily separated from the board 10 where the coolant jacket 11 is installed, through the above-described process. The separated coolant jacket 11 may be coupled to the board in a process opposite to the above-described process.

Since the board 10 on which the coolant jacket 11 is installed is manufactured with high accuracy, a process of separating the coolant jacket 11 from the board 10 without any damage requires lots of time and effort according to a related technology. However, according to the board coolant jacket jig system 1 according to the present exemplary embodiment, the coolant jacket 11 may be safely, conveniently, efficiently, and easily separated from the board 10.

Also, according to the board coolant jacket jig system 1 according to the present exemplary embodiment, maintenance and repair of the board 10 is safely and easily performed so that productivity may be improved and repair costs of the board 10 may be reduced.

In the above-described exemplary embodiment, the coolant jacket 11 is coupled to both sides, that is, each of the upper and lower sides, of the board 10 and is separated using the board coolant jacket jig system 1 according to the present exemplary embodiment. However, the board coolant jacket jig system 1 according to the present exemplary embodiment may be applied to a case in which the coolant jacket 11 is coupled to only one of the upper and lower sides of the board 10. In this case, the plate elevation unit 220 may be omitted from the board coolant jacket jig system 1 according to the present exemplary embodiment. In other embodiments, a cover having the bolts 212 may be omitted, and only the plate elevation unit 220 is used to couple the lower cooling jacket 11*b* to a board 10.

As described above, according to the present general inventive concept, the coolant jacket may be efficiently and easily separated from the board in a state in which the board is supported.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A board coolant jacket jig system comprising:
    a main frame that comprises a board installation stand on which a board is installed; and
    a coolant jacket separation unit that is coupled to the main frame and selectively coupled to a coolant jacket coupled to the board, to separate the coolant jacket, wherein the coolant jacket separation unit comprises an upper cover portion that is relatively rotatably coupled to the main frame to be capable of being selectively coupled to and disassembled from the coolant jacket arranged on an upper side of the board installed on the board installation stand.

2. The board coolant jacket jig system of claim 1, wherein the upper cover portion comprises:
    an upper panel that is relatively rotatably coupled to the main frame and comprises a plate facing portion formed by penetrating the upper panel so that the coolant jacket of the board is accessed from the outside when the board is installed on the board installation stand;
    a panel plate coupling member that couples the coolant jacket and the upper panel; and
    a panel link that is rotatably coupled to each of the upper panel and the main frame and connects the upper panel and the main frame to control a rotation operation of the upper panel.

3. The board coolant jacket jig system of claim 1, wherein the coolant jacket separation unit further comprises a plate elevation unit that is coupled to the main frame to ascend or descend the coolant jacket arranged on a lower side of the board installed on the board installation stand.

4. The board coolant jacket jig system of claim 3, wherein the coolant jacket elevation unit comprises:
    a plate support portion that supports the coolant jacket from under the board;
    an elevation unit main body portion that is coupled to the main frame to support the plate support portion; and
    an elevation support portion that connects the plate support portion and the elevation unit main body portion to allow the plate support portion to move close to or away from the elevation unit main body portion.

5. The board coolant jacket jig system of claim 4, wherein the elevation support portion comprises:
    a pair of first support members, each having one end portion movably coupled to the plate support portion and the other end portion rotatably coupled to the elevation unit main body portion;
    a pair of second support members, each having one end portion rotatably coupled to the plate support portion and the other end portion movably coupled to the elevation unit main body portion; and
    a pair of coupling members that couple the first support members and the second support members to rotate the first support members and the second support members by being engaged with each other.

6. The board coolant jacket jig system of claim 5, wherein the elevation support portion comprises:
    a fixed member that is fixedly coupled to the elevation unit main body portion;
    a movable member that is coupled to the elevation unit main body portion to be capable of moving close to or away from the fixed member and coupled to the other end portion of each of the second support members that is coupled to the elevation unit main body portion; and
    a connection rod that connects the fixed member and the movable member to adjust an interval therebetween.

7. The board coolant jacket jig system of claim 2, wherein the main frame comprises:
    a first support portion that has the board installation stand and supports the board; and
    a second support portion that supports the plate elevation unit.

8. The board coolant jacket jig system of claim 7, wherein the main frame further comprises:
    a rotation bracket that is provided on a lower surface of the main frame to be capable of relatively rotating with respect to the main frame; and
    a wheel that is rotatably coupled to the rotation bracket.

9. The board coolant jacket jig system of claim 1, wherein the board installation stand comprises:
    a pair of board guides that are provided at the main frame to guide the board from the opposite lateral sides of the board to be slidably installed; and
    a board stopper that is provided at an end portion of each of the board guides to prevent escape of the board.

10. The board coolant jacket jig system of claim 1, further comprising:
    a coolant pump that is connected to the coolant jacket and exhausts coolant from an inside of the coolant jacket or supplies the coolant to the inside of the coolant jacket; and
    a coolant storage tank that is connected to the coolant pump and stores the coolant exhausted from the coolant jacket.

11. The board coolant jacket jig system of claim 10, further comprising a coolant pressure gauge that is connected between the coolant jacket and the coolant pump and measures pressure of the coolant when the coolant of the coolant jacket is exhausted or supplied by the coolant pump.

12. The board coolant jacket jig system of claim 10, further comprising:
    an air supply portion that is connected to a coolant input hose connected to the coolant jacket and supplies air; and a valve that turns on or off air supply from the air supply portion to the coolant input hose.

13. A method of separating a board coolant jacket, the method comprising:
    installing a board, to which a coolant jacket is coupled, on a board installation stand of a main frame;
    exhausting coolant of an inside of the coolant jacket;
    covering the board with an upper panel of an upper cover portion;
    coupling the coolant jacket and the upper panel;
    disassembling the coolant jacket and the board;
    performing an opening operation by relatively rotating the upper panel; and
    taking outside the board from which the coolant jacket is separated.

14. The method of claim 13, wherein the coolant jacket is coupled to each of upper and lower sides of the board, the method further comprising:
    supporting the coolant jacket arranged on the lower side of the board by raising a plate support portion of a plate elevation unit, before the coolant jacket and the board are disassembled from each other; and
    performing an opening operation by lowering the plate support portion and the relatively rotating the upper panel, after the coolant jacket and the board are disassembled from each other.

15. The method of claim 14, wherein, in the disassembling of the coolant jacket and the board from each other, the coolant jacket and a coupling member of the board are disassembled from each other through a plate facing portion formed by penetrating the upper panel.

16. A coolant jacket system to cool a printed circuit board, comprising:
    a main frame including a first support portion and a second support portion;
    a printed circuit board mounted on the first support portion;
    a coolant jacket including an upper coolant jacket and a lower coolant jacket to surround the printed circuit board; and
    a coolant jacket separation unit mounted on both of the first support portion and the second support portion respectively, comprising:
        an upper cover portion including a plurality of panel plate coupling members to couple the upper coolant jacket to the upper cover portion; and
        a plate elevation unit to couple the lower coolant jacket to the printed circuit board to cool the printed circuit board.

17. The coolant jacket system of claim 16, wherein the panel plate coupling members are disposed at peripheral edges of the upper cover portion.

18. The coolant jacket system of claim 16, wherein the plate elevation unit includes a plurality of slots in order to adjust the height of the plate elevation unit.

19. The coolant jacket system of claim 16, wherein the upper cover portion is coupled to the plate elevation unit such that when the upper cover is opened the plate elevation unit is lowered.

* * * * *